United States Patent [19]

Imaji et al.

[11] Patent Number: 5,513,072
[45] Date of Patent: Apr. 30, 1996

[54] POWER MODULE USING IMS AS HEAT SPREADER

[75] Inventors: Yoshiaki Imaji, Chiba; Satoshi Nakao, Mobara; Hiroshi Sawano, Yokohama, all of Japan

[73] Assignee: Kabushiki Kaisha Toshiba, Kawasaki, Japan

[21] Appl. No.: 344,656

[22] Filed: Nov. 18, 1994

[30] Foreign Application Priority Data

Nov. 18, 1993 [JP] Japan .................... 5-289251

[51] Int. Cl.⁶ .................................... H05K 7/20
[52] U.S. Cl. ................ 361/707; 257/713; 361/719
[58] Field of Search ................ 174/16.3, 252; 165/80.3, 185; 257/685, 691, 700, 701, 706, 707, 709, 711, 713, 725; 361/689, 704, 705, 707, 713, 718, 719, 761, 764, 776, 784

[56] References Cited

U.S. PATENT DOCUMENTS

| | | | |
|---|---|---|---|
| 4,908,738 | 3/1990 | Kobari | 361/429 |
| 5,118,903 | 6/1992 | Schupp | 174/16.3 |
| 5,398,160 | 3/1995 | Umeda | 361/707 |
| 5,408,128 | 4/1995 | Furnival | 257/690 |
| 5,422,515 | 6/1995 | Endo | 257/691 |

*Primary Examiner*—Gerald P. Tolin
*Attorney, Agent, or Firm*—Oblon, Spivak, McClelland, Maier & Neustadt

[57] ABSTRACT

In the present invention, a heat spreader, circuit boards for power semiconductor elements, and a circuit board for a control circuit are fixed on a metal plate. The heat spreader is made of an IMS. The IMS has a metal base made of Cu or Cu clad plate, and a high heat radiating insulating layer made of a resin-based material, and the metal plate and the heat spreader are adhered by the high heat radiating insulation layer and electrically insulated from each other. Only a power semiconductor element is soldered onto the heat spreader. A wiring pattern for guiding each terminal of the power semiconductor element to the outside is formed on a power circuit board. A control circuit for controlling the power semiconductor element is formed on the circuit board for the control circuit.

6 Claims, 3 Drawing Sheets

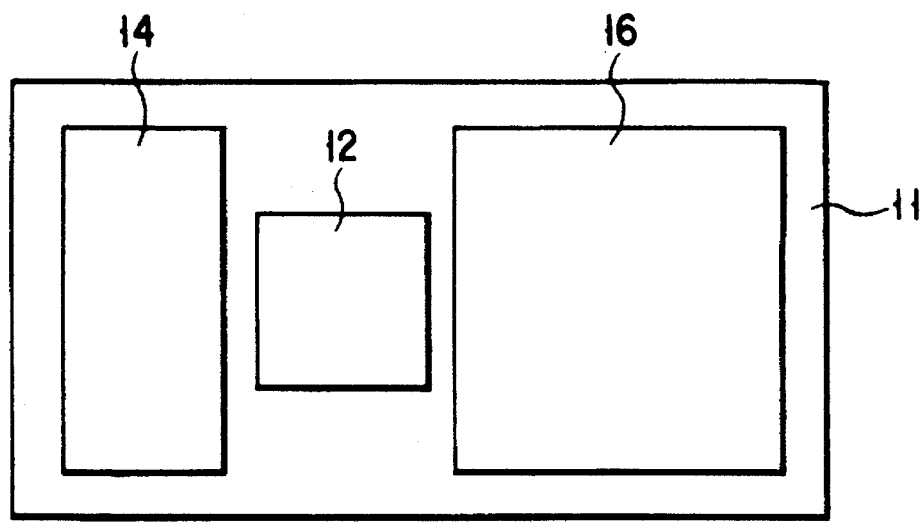
F I G. 5
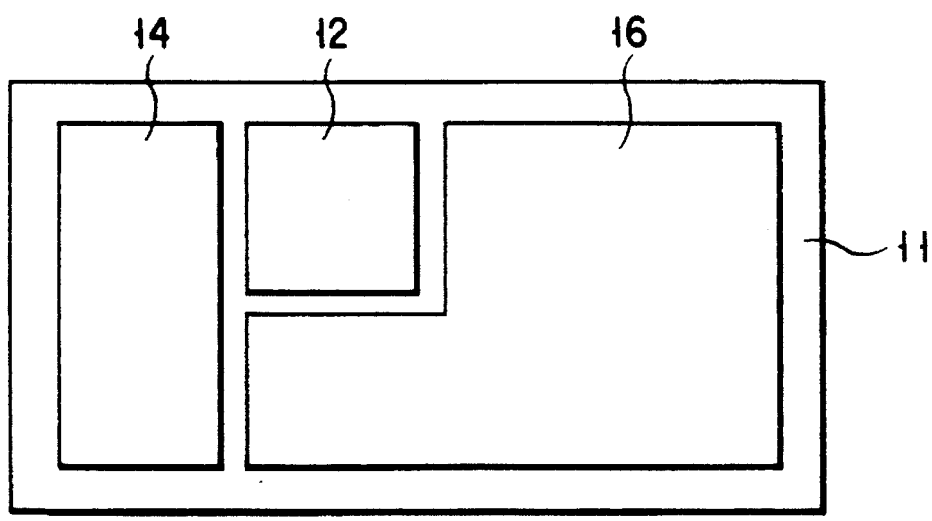
F I G. 6

POWER MODULE USING IMS AS HEAT SPREADER

BACKGROUND OF THE INVENTION

1. Field of the Invention

The present invention relates to a power module, and more specifically to an intelligent power module in which a power semiconductor element and a peripheral control circuit for controlling the power semiconductor element are combined.

2. Description of the Related Art

There is a tendency that a power module is constructed as an intelligent power module in which a power semiconductor element and peripheral control circuits are combined, as in an inverter. The heat radiating characteristics are regarded to be an important factor in a power module. A DBC substrate has a structure in which a ceramic plate is sandwiched between copper plates, and is expensive. For this reason, in low to middle power modules, an insulated metal substrate (IMS) is used in many cases. The IMS has a structure in which an insulation layer is formed on a metal base made of, for example, aluminum, and a desired conducting pattern is formed on the insulation layer.

FIG. 1 is a cross section of a conventional power module in which an IMS is used. The IMS consists of a metal base 301, a high heat radiating insulation layer 302, and a conductor pattern 303 formed on the high heat radiating insulation layer 302. The power semiconductor element 31 is soldered onto a heat spreader 32 fixed on the conductor pattern 303 of the IMS 30. Semiconductor elements 33 such as transistors and capacitors, which serve as control circuits for the power semiconductor element 31, are connected to the conductor pattern 303 on the IMS 30.

With the above-described structure in which both a power semiconductor element portion and a control circuit are provided on a common plate of IMS 30. In order to avoid this, it is necessary to maintain a predetermined distance or more between wiring regions of these portions. Therefore, the flexibility in designing of the IMS 30 is low. For example, in some cases, it is difficult to match the terminals of the IMS 30 with the predetermined position of the terminals of the enclosure. Further, the control circuit is complicated, and it is also necessary in the power module to mount elements at a high density by using fine wiring materials.

As shown in FIG. 2, the IMS 30 is formed to have a partial double-layer structure in which only the control circuit portion is made into a double-layer. The double-layer structure includes a high heat radiating insulation layer 302b, which is the second layer, formed on a conductor pattern 303a, which is the first layer, and a conductor pattern 303b, which is the second layer, formed on the layer 302b. In the IMS 30 having such a partial double-layer structure, both wiring regions for the power semiconductor element portion and the control circuit portion are insulated by the high heat radiating insulation layer 302b.

However, since the IMS 30, which is partially double-layered, has a very complex structure, and is prepared by a very complex production process, the production cost for the IMS 30 is very much increased, and it should not be applied to inverters for household appliances or other general items. In the case where only the output of the power semiconductor element is varied, it is necessary to redesign the entire IMS 30 including the control circuit portions and the like, increasing the cost for the developing and consuming a great deal of time.

SUMMARY OF THE INVENTION

The object of the invention is to provide a power module which can be easily designed, and manufactured at a low cost. The object can be achieved by the following structure:

A power module comprising:
- a power semiconductor element;
- a heat spreader using an IMS and mounting the power semiconductor element;
- a first circuit board situated adjacent to the heat spreader, and serving as a wiring section of the power semiconductor element;
- a second circuit board, situated adjacent to the heat spreader and mounting at least one semiconductor element which controls the power semiconductor element; and
- a metal plate attached to a back surface of the heat spreader and each of the first and second circuit board.

According to the present invention, the IMS is used only as the heat spreader, and the use area of the IMS can be significantly reduced, thus achieving a low production cost. Further, since the first and second circuit boards are separately prepared, the designing thereof is facilitated. Moreover, inexpensive print boards or the like can be used as first and second circuit boards, and the production cost of the power module can be further decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
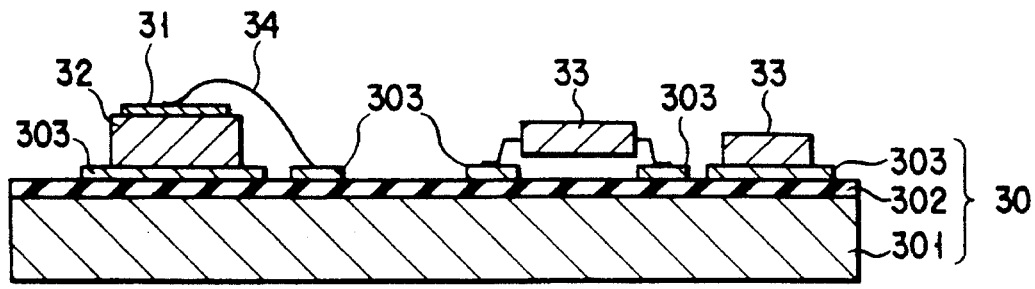
FIG. 1 is a cross section of the first conventional power module in which an IMS is used.
Figure 2:
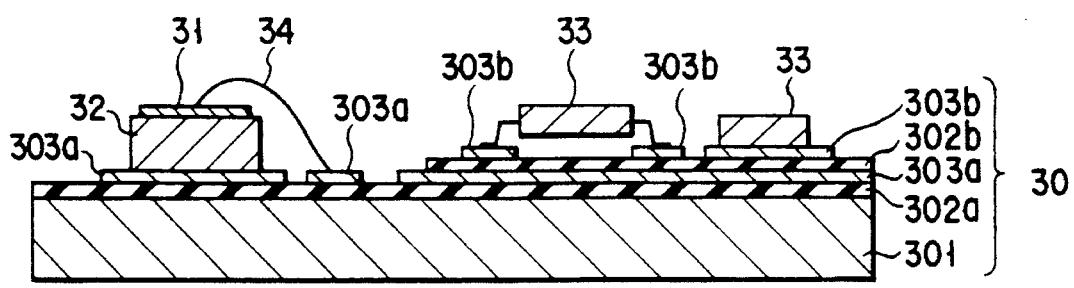
FIG. 2 is a cross section of the second conventional power module in which an IMS is used.
Figure 3:
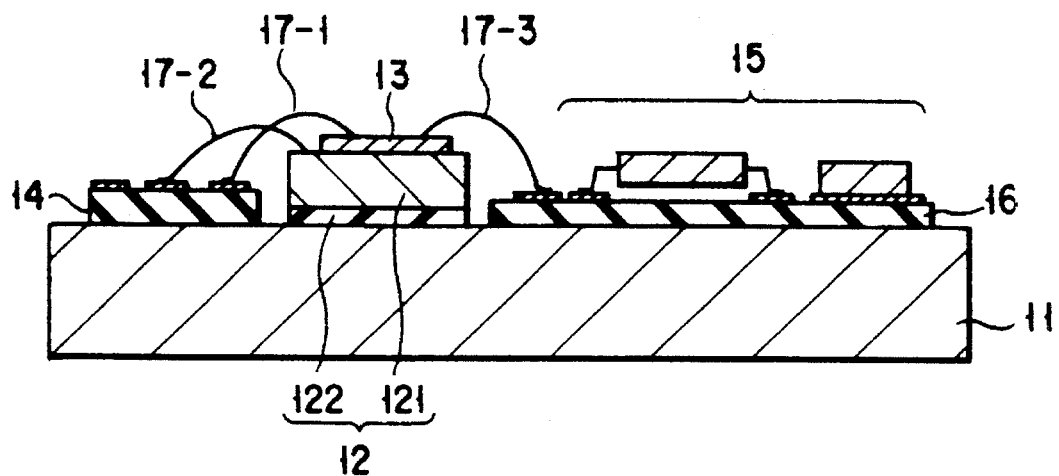
FIG. 3 is a cross section showing the structure of a power module according to the first embodiment of the present invention.

FIG. 3 is a cross section showing the structure of the power module according to the first embodiment of the present invention. A heat spreader 12, a circuit board 14 for power semiconductor elements (to be called "power circuit board" hereinafter), a circuit board 16 for a control circuit (to be called "control circuit board") are fixed on a metal plate 11 made of Al, Cu or the like by adhesion or soldering. The heat spreader 12 according to the present invention is formed by using an IMS. The IMS consists of a metal base 121 made of Cu or a Cu clad plate (Cu and kovar, Cu and invar or the like) and a high radiating insulation layer 122 made of an epoxy-based, or polyimide-based resin or the like, and the metal plate 11 and the heat spreader 12 are adhered to each other via the insulation layer 122 and are electrically insulated from each other.

Only a power semiconductor element 13 is soldered to the heat spreader 12. A wiring pattern is formed on the power circuit board 14 such that the terminals of the power semiconductor element 13 are guided to the outside. A control circuit 15 for controlling the power semiconductor element 13 by control semiconductor elements such as transistors and capacitors, is formed on the control circuit board 16. For preparing the power circuit board 14 and the control circuit board 16, printed circuit boards or general substrate circuit boards are used. The power semiconductor element 13, the power circuit board 14 and the control circuit board 16 are electrically connected to each other via bonding wires 17-1, 17-2 and 17-3. The power semiconductor 13 is, for example, a power transistor, the wiring for the emitter is the bonding wire 17-1, the wiring for the collector is the bonding wire 17-2 extended out from the heat spreader 12 brought into contact with the rear surface of the power semiconductor element 13, and the wiring for the base is the bonding wire 17-3 connected to a predetermined section of the control circuit board 16.

In the above-described embodiment, the power circuit board 14 and the control circuit board 16 are separately arranged on the metal plate 11, and therefore the electromagnetic interference does not occur therebetween. The flexibility in designing the power module increases. Consequently, it is facilitated to align the positions of the terminals of the circuit board with the predetermined positions of the terminals of the enclosure. Even in the case where a different type of the power semiconductor elements 13 is used, it only suffices if the wiring of the power circuit board 14 is redesigned unless the chip size of the power circuit board element does not greatly change. Therefore, the cost for development can be reduced, and the time period therefore can be shortened.

Figure 4:
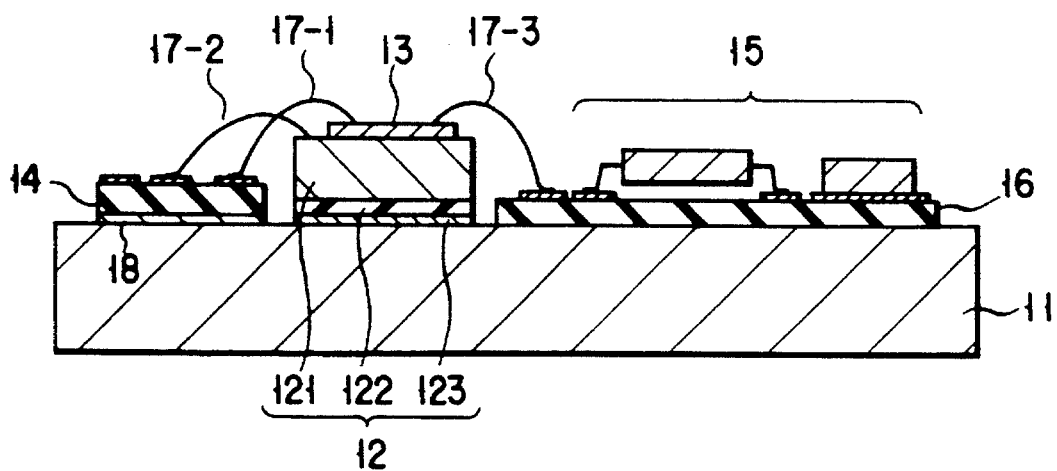
FIG. 4 is a cross section showing the structure of a power module according to the second embodiment of the present invention; and Each of FIGS. 5 and 6 is a plan view showing a layout of the heat spreader and the circuit boards, according to the present invention.

FIG. 4 is a cross section showing the structure of the power module according to the second embodiment of the present invention. The power module shown in FIG. 4 differs from that of FIG. 3 in the structure of the heat spreader 12. In this embodiment, the heat spreader 12 consists of a metal base 121, a high radiating insulation layer 122, and a conductor layer 123 as the lowest layer. The heat spreader 12 shown in FIG. 4 is fixed to the metal plate 11 by soldering. Further, the power module of FIG. 4 differs from that of FIG. 3 in the aspect where an aluminum plate 18 is fixed to the rear surface of the power circuit board 14. As compared to the structure shown in FIG. 3, the power module of FIG. 4 is slightly more expensive since it includes a conductor layer 123 and an aluminum plate 18; however an excellent heat conductivity with respect to the metal plate 11 can be achieved, and some other advantages can be obtained in accordance with the production process.

FIGS. 5 and 6 are plan views each illustrating a layout of the heat spreader 12, the power circuit board 14 and the control circuit board 16. FIG. 5 shows a regular layout, and FIG. 6 shows a layout in the case of a high integration where there are a great number of circuits mounted.

As described above, in the power module of the present invention, an IMS is used as a heat spreader. Therefore, the use area of the IMS can be significantly reduced, thus decreasing its production cost, as compared to the conventional technique. Moreover, print circuit boards or the like can be used for the power circuit boards and control circuit boards, thus making it possible to further reduce the cost. Thus, according to the present invention, a power module can be provided at a low cost.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A power module comprising:

a power semiconductor element;

a heat spreader using an IMS and mounting only said power semiconductor element;

a first circuit board situated adjacent to said heat spreader, and serving as a wiring section of said power semiconductor element;

a second circuit board, situated adjacent to said heat spreader, and mounting at least one semiconductor element which controls said power semiconductor element; and a metal plate attached to a back surface of said heat spreader and each of said first and second circuit boards.

2. A power module according to claim 1, wherein said IMS includes a metal layer containing Cu and a high heat radiating insulation layer in contact with said metal plate.

3. A power module according to claim 1, wherein said IMS has a high heat radiating insulation layer between a metal containing Cu and a metal layer in contact with said metal plate.

4. A power module according to claim 1, wherein a further metal layer is fixed to a back surface of said first circuit board.

5. A power module according to claim 2, wherein a further metal layer is fixed to a back surface of said first circuit board.

6. A power module according to claim 3, wherein a further metal layer is fixed to a back surface of said first circuit board.

\* \* \* \* \*